United States Patent [19]

Maruta

[11] Patent Number: 4,667,118

[45] Date of Patent: May 19, 1987

[54] MONOSTABLE MULTIVIBRATOR

[75] Inventor: Shuichiro Maruta, Yokohama, Japan

[73] Assignee: Kabushiki Kaisha Toshiba, Kawasaki, Japan

[21] Appl. No.: 701,353

[22] Filed: Feb. 13, 1985

[30] Foreign Application Priority Data

Mar. 7, 1984 [JP] Japan .................................. 59-43382

[51] Int. Cl.$^4$ ....................... H03K 3/284; H03K 3/10; H03K 5/04
[52] U.S. Cl. .................................. 307/273; 307/265; 328/58; 328/207
[58] Field of Search ............... 307/265, 273, 603, 605, 307/608; 328/58, 207

[56] References Cited

U.S. PATENT DOCUMENTS

| | | | |
|---|---|---|---|
| 3,484,624 | 12/1969 | Rasiel et al. | 307/265 |
| 3,569,842 | 3/1971 | Schroyer | 307/228 |
| 3,582,687 | 6/1971 | Bellomo | 307/273 |
| 4,015,145 | 3/1977 | Stewart | 307/273 |
| 4,063,115 | 12/1977 | Okuhara et al. | 307/252 G |

FOREIGN PATENT DOCUMENTS 0151520 8/1984 Japan .................... 307/273

*Primary Examiner*—Stanley D. Miller
*Assistant Examiner*—Trong Quang Phan
*Attorney, Agent, or Firm*—Finnegan, Henderson, Farabow, Garrett & Dunner

[57] ABSTRACT

There is disclosed a monostable multivibrator in which a latch circuit or flip-flop circuit and a comparator circuit are separated. The comparator circuit compares a reference potential and an output potential of a time constant circuit and produces an output signal. The flip-flop circuit is controlled in accordance with an output signal of the comparator circuit.

14 Claims, 17 Drawing Figures

A  SET TRIGGER SIGNAL Si

B  CAPACITOR VOLTAGE

C  OUTPUT VOLTAGE Vout

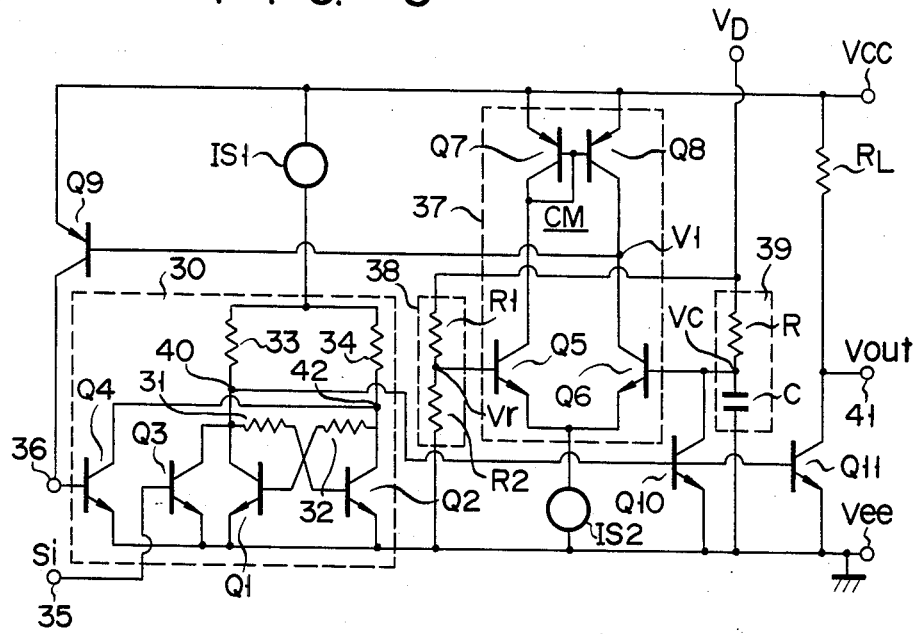
FIG. 3
FIG. 4A  SET TRIGGER SIGNAL Si 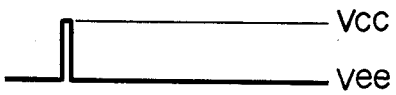
FIG. 4B  RESET OUTPUT OF F.F. CIRCUIT 30 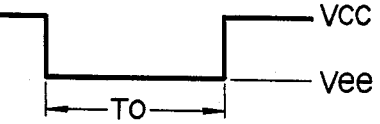
FIG. 4C  CAPACITOR VOLTAGE Vc 
FIG. 4D  RESET INPUT OF F.F. CIRCUIT 30 
FIG. 4E  OUTPUT VOLTAGE Vout 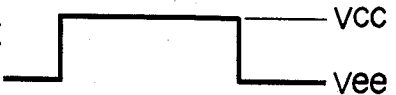

| FIG. 6A | SET TRIGGER SIGNAL Si |
| FIG. 6B | RESET OUTPUT OF F.F. CIRCUIT 30 |
| FIG. 6C | CAPACITOR VOLTAGE Vc |
| FIG. 6D | RESET INPUT OF F.F CIRCUIT 30 |
| FIG. 6E | OUTPUT VOLTAGE Vout |

MONOSTABLE MULTIVIBRATOR

BACKGROUND OF THE INVENTION

This invention relates to a monostable multivibrator formed of bipolar transistors.

Monostable multivibrators include those of a linear circuit type formed of bipolar transistors and those of a digital circuit type formed of MOSFETs (metal oxide semiconductor field effect transistor). Linear circuit type multivibrators have been generally used for a motor control circuit.

A conventional linear circuit type monostable multivibrator is shown in FIG. 1. In FIG. 1, a PNP multicollector transistor Q1 and an NPN transistor Q2 constitute a thyristor 1. Reference numeral 2 is a bias circuit or voltage divider for providing a reference bias voltage Vr to the base of transistor Q1. The bias circuit 2 comprises resistors R1 and R2, serially connected between a Vcc power source potential (positive potential) and a Vee power source potential (ground). The junction of resistors R1 and R2 is connected to the base of transistor Q1 and the collector of transistor Q2. A time constant circuit 3 comprises a resistor R and a capacitor C connected in series between Vcc and Vee power source potentials. The junction of resistor R and capacitor C is connected to the emitter of transistor Q1. An NPN transistor Q3 is for receiving a set signal. The base of transistor Q3 is connected to a set input terminal 4 and is supplied with a set signal. The emitter of transistor Q3 is connected to the Vee power source potential. The collector of transistor Q3 is connected to the base of transistor Q2 and one of the multicollectors of transistor Q1. An NPN transistor Q4 is used as an output buffer. The emitter of transistor Q4 is connected to the Vee power source potential. The collector of transistor Q4 is connected to an output terminal 5 of the whole vibrator circuit. The collector of transistor Q4 is also connected to the Vcc power source potential through a load resistor $R_L$. The base of transistor Q4 is connected to another collector of transistor Q1.

The following is the operation of the prior art multivibrator as shown in FIG. 1. In a normal state, thyristor 1 is in the ON state. Now assume that thyristor 1 is in the ON state. At this time, transistor Q4 as an output buffer is ON, and an output voltage Vout of vibrator output terminal 5 is at a low level (substantially, ground potential). Now also assume that a high level (Vcc potential) set trigger signal Si (FIG. 2A) is input to the set input terminal 4. When the trigger signal is supplied to the terminal 4, transistor Q3 is turned momentarily ON to turn transistor Q2 OFF. Therefore, thyristor 1 is turned OFF. Thus, transistor Q4 is turned OFF, and the output voltage Vout (FIG. 2C) is changed to a high level. When thyristor 1 is turned OFF, an electric current starts to flow through time constant circuit 3 to charge capacitor C. When a predetermined period To of time has passed from the time when an electric current has started to flow through the time constant circuit 3 and a capacitor voltage Vc (FIG. 2B) across capacitor C exceeds the sum of bias voltage Vr and the emitter base voltage VbeQ1 of transistor Q1, thyristor 1 returns to the ON state and an output voltage Vout returns to the low level.

As clearly understood from the above, the pulse width of the output voltage Vout equals the time period To. The time To is determined by the reference bias voltage Vr, a base-emitter voltage VbeQ1 of transistor Q1 and a time constant defined by a capacitance of the capacitor C and a resistance of the resistor R of the time constant circuit 3. However, as well known, the emitter-base voltage VbeQ1 of transistor Q1 generally has a temperature dependence characteristic of $-2$ mV/°C. Therefore, the time To, which is dependent of the emitter-base voltage VbeQ1, also has a temperature dependency characteristic. When, for example, transistor Q1 has a temperature dependency characteristic of $-2$ mV/°C. and power source potential Vcc is 5 V, the capacitor voltage Vc varies 5 mV upon a temperature variation of 2.5° C. This temperature variation is 0.1% of 5 V (power source potential Vcc). Therefore, when the monostable multivibrator is incorporated into a motor control circuit in a band held tape recorder set, the motor control circuit has also a temperature dependency characteristic. This lowers the waw characteristic of the motor control circuit.

SUMMARY OF THE INVENTION

This invention has been achieved under the above-mentioned circumstances and its object is to provide a monostable multivibrator whose output voltage pulse is independent of temperature.

According to the invention, there is provide a monostable multivibrator comprising:

a voltage dividing means for dividing a voltage defined by first and second potentials to generate a reference potential;

a time constant circuit means applied with said voltage;

a comparator circuit means for comparing a reference potential of the voltage dividing means and an output potential of the time constant circuit means;

a reset signal generating means for generating a reset input signal in response to an output signal of the comparator circuit means;

a set input terminal to which a set input signal is supplied;

a latch circuit means to which a reset input signal of the reset signal generating means and a set input signal of the set input terminal are applied to produce set and reset output signals; and a switch means turned on in response to one of the output signals of the latch circuit means to discharge a charge stored at the time constant circuit means.

BRIEF DESCRIPTION OF THE DRAWINGS

FIG. 3 is a circuit diagram of a monostable multivibrator according to an embodiment of the invention;

FIGS. 4A to 4E are time charts of wave forms of signals at respective points of the circuit of FIG. 3;

FIGS. 6A to 6E are time charts of wave forms of signals at respective points of the circuit of FIG. 5.

DETAILED DESCRIPTION OF THE PREFERRED EMBODIMENTS

Figure 1:
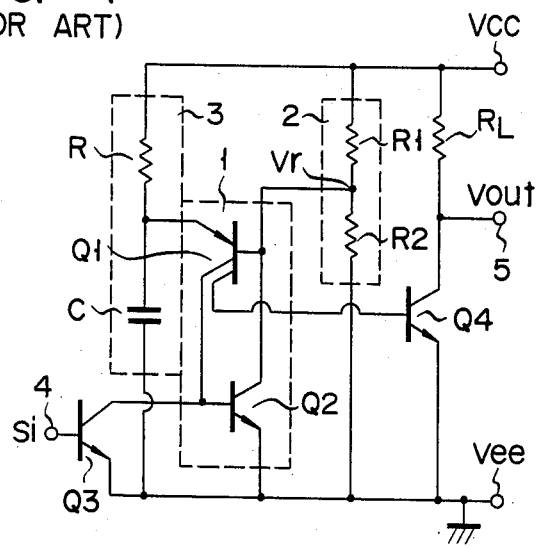
FIG. 1 is a circuit diagram of a conventional monostable multivibrator.
Figure 2:
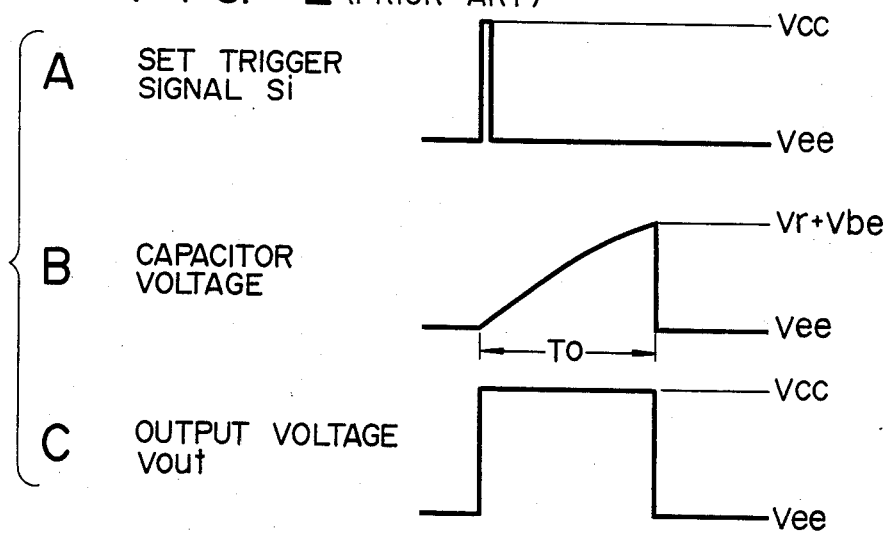
FIGS. 2A to 2C are time charts of wave forms of signals at respective points of the circuit of FIG. 1.

There will now be described a monostable multivibrator according to an embodiment of the invention with reference to FIG. 3 and FIGS. 4A to 4E.

In the circuit of FIG. 3, a flip-flop circuit 30 comprises NPN transistors Q1, Q2, Q3 and Q4 and resistors 33 and 34. The collector of transistor Q1 is connected to the base of transistor Q2 through a resistor 31. Similarly, the collector of transistor Q2 is connected to the base of transistor Q1 through a resistor 32. The emitters of transistors Q1 and Q2 are interconnected and are also connected to a low power source potential Vee, e.g., ground potential. One terminal of resistor 33 is connected to the collector of transistor Q1, and the other terminal of resistor 33 is connected to a high power source potential Vcc through a current source IS1. Resistor 33 is a load resistor for the collector of transistor Q1. One terminal of resistor 34 is connected to the collector of transistor Q2, and the other terminal of resistor 34 is connected to high power source potential Vcc through current source IS1. Resistor 34 is a load resistor for the collector of transistor Q2. Transistor Q3 is for receiving a set signal. The channel of transistor Q3 is connected to the channel of transistor Q1 in parallel; specifically, the collector and emitter of transistor Q3 are connected to the collector and emitter of transistor Q1, respectively. The base of transistor Q3 is connected to a set input terminal 35. The set input terminal 35 is supplied with a set input signal. Transistor Q4 is for receiving a reset input signal. The channel of transistor Q4 is connected to the channel of transistor Q2 in parallel; specifically, the collector and emitter of transistor Q4 are connected to the collector and emitter of transistor Q2, respectively. The base of transistor Q4 is connected to a reset input terminal 36. The reset input terminal 36 is supplied with a reset input signal.

A comparator circuit 37 comprises NPN transistors Q5 and Q6 and a current mirror circuit CM. The emitters of transistors Q5 and Q6 are interconnected and are also connected to low power source potential Vee through a current source IS2. Transistors Q5 and Q6 form a differential circuit. Current mirror circuit CM comprises PNP transistors Q7 and Q8. The bases of transistors Q7 and Q8 are interconnected. The emitters of transistors Q7 and Q8 are commonly connected to high power source potential Vcc. The base and collector of transistor Q7 are interconnected and also connected to the collector of transistor Q5. The collector of transistor Q8 is connected to the collector of transistor Q6. An output voltage Vl of comparator circuit 37 is taken out from the junction of the collectors of transistors Q6 and Q8. A PNP transistor Q9 is for generating a reset input signal. The emitter and collector of transistor Q9 connected to high power source potential Vcc and reset input terminal 36, respectively. The base of transistor Q9 is connected to the junction of the collectors of transistors Q6 and Q8 and is applied with an output voltage Vl of comparator circuit 37. A voltage divider circuit 38 forms a reference voltage generating circuit for producing a reference voltage Vr. Voltage divider circuit 38 comprises resistors R1 and R2 connected in series between a predetermined potential Vd and low power source potential Vee. Resistor R1 is provided at the predetermined potential Vd side and resistor R2 is provided at the low power source potential Vee side. The predetermined voltage Vd is a higher potential than the low power source potential Vee. Predetermined voltage Vd may be a high power source potential Vcc. An output voltage Vr of the divider circuit 38 is taken out from the junction of resistors R1 and R2. The output voltage Vr may be expressed as:

$$Vr = Vcc \times \frac{R2}{R1 + R2}$$

The base of transistor Q5 is connected to the junction of resistors R1 and R2 and is applied with an output voltage Vr of the voltage divider 38.

The time constant circuit 39 comprises a resistor R and a capacitor C connected in series between the predetermined voltage Vd and lower power source potential Vee. Resistor R is connected to the predetermined voltage Vd side. Capacitor C is connected to the low power source potential side.

An NPN transistor Q10 is connected across capacitor C. That is, the collector of transistor Q10 is connected to the predetermined potential Vd side terminal of capacitor C, and the emitter of transistor Q10 is connected to the lower power source potential Vee terminal. The base of transistor Q10 is connected to the collector of transistor Q1 or the reset output terminal 40 of flip-flop circuit 30. Transistor Q10 is used as a reset switch for capacitor C.

The base of an NPN transistor Q11 is connected to the reset output terminal 40. The collector of transistor Q11 is connected to high power source potential Vcc through a load resistor $R_L$ and also is connected to an output terminal 41 of the whole vibrator circuit. The emitter of transistor Q11 is connected to low power source potential Vee. Transistor Q11 is used as an output buffer.

There will be described the operation of the multivibrator as shown in FIG. 3 with reference of FIGS. 4A to 4E.

In a normal state, reset output terminal 40 of flip-flop circuit 30 is at a high level. Now assume that flip-flop circuit 30 is at a normal state. At this time, reset switch transistor Q10 and output buffer transistor Q11 are both in the ON state. Since transistor Q11 is in the ON state, an output voltage Vout (FIG. 4E) of vibrator output terminal 41 is at a low level. Also since transistor Q10 is in the ON state, a capacitor voltage Vc (FIG. 4C) at the junction of resistor R and capacitor C of time constant circuit 39, which is applied to the base of transistor Q6 of comparator circuit 37, is lower than a reference voltage Vr at the junction of resistors R1 and R2 of divider circuit 38, which is applied to the base of transistor Q5 of comparator circuit 37. Thus, an electric current flows through current mirror circuit CM, and the output voltage Vl of comparator 37 is at a high level. Therefore, transistor Q9, as a reset signal generator whose base is applied with the voltage Vl, is in the OFF state and, thus, transistor Q4, as a reset switch, is also rendered OFF. In this state, now assume that a set trigger signal Si (FIG. 4A) of a high level is inputted to set input terminal 35. At this time, transistor Q3 is momentarily rendered ON to set flip-flop circuit 30. Therefore, reset output terminal 40 is changed to a low level, and transistors Q10 and Q11 are both rendered OFF. Since transistor Q11 is rendered OFF, the output voltage Vout of vibrator output terminal 41 is changed to a high level. Also since transistor Q10 is rendered OFF, an electric current starts to flow through time constant circuit 39 to charge capacitor C.

When a predetermined period TO of time, which is determined by the reference voltage Vr and the time constant defined by a capacitance of capacitor C and a resistance of resistor R, has passed from the time when an electric current has started to flow and capacitor voltage Vc exceeds reference voltage Vr to change the comparator output voltage Vl to a low level, an electric current starts to flow into transistor Q6 through the emitter-base path of transistor Q9. Therefore, transistor Q9 is rendered ON and, thus, transistor Q4 is also rendered ON. Therefore, flip-flop circuit 30 is reset and the potential of reset output terminal 40 (FIG. 4B) is changed to a high level. Since reset output terminal 40 is changed to a high level, transistor Q10 is turned ON to discharge capacitor C. Thus, comparator output voltage Vl is returned to a high level to turn transistor Q9 OFF. Thus, transistor Q9 produces a reset input signal (FIG. 4D) to reset input terminal 36. Therefore, transistor Q4 is also turned OFF and reset output terminal 40 is maintained at a high level or reset state (normal state). Also since reset output terminal 40 is changed to a high level, transistor Q11 as an output buffer is turned ON and an output voltage Vout of vibrator output terminal 41 is changed to a low level.

In the monostable multivibrator of the embodiment described above, flip-flop circuit or latch circuit 30 and comparator circuit 37 are separated. Therefore, an emitter-base voltage of any transistor does not constitute a component to define the pulse width of the output voltage Vout. A pulse width of the output voltage Vout of vibrator output terminal 41 equals the time period TO and is determined by the reference voltage Vr and the time constant defined by a capacitance of capacitor C and a resistance of resistor R. Therefore, with the monostable multivibrator discribed above, an output voltage of a pulse width independent of temperature is provided.

Also in the multivibrator of the embodiment above, a reference voltage Vr is given by voltage divider 38 comprising the resistors. Therefore, a voltage divider having a good temperature characteristic is used as the voltage divider 38 so that a reference voltage Vr independent of temperature may be obtained.

Also with the multivibrator described above, a predetermined potential Vd is commonly connected to both time constant circuit 39 and reference voltage circuit 38 so that circuits 38 and 39 may be independent of any variation at the power source voltage.

Figure 5:
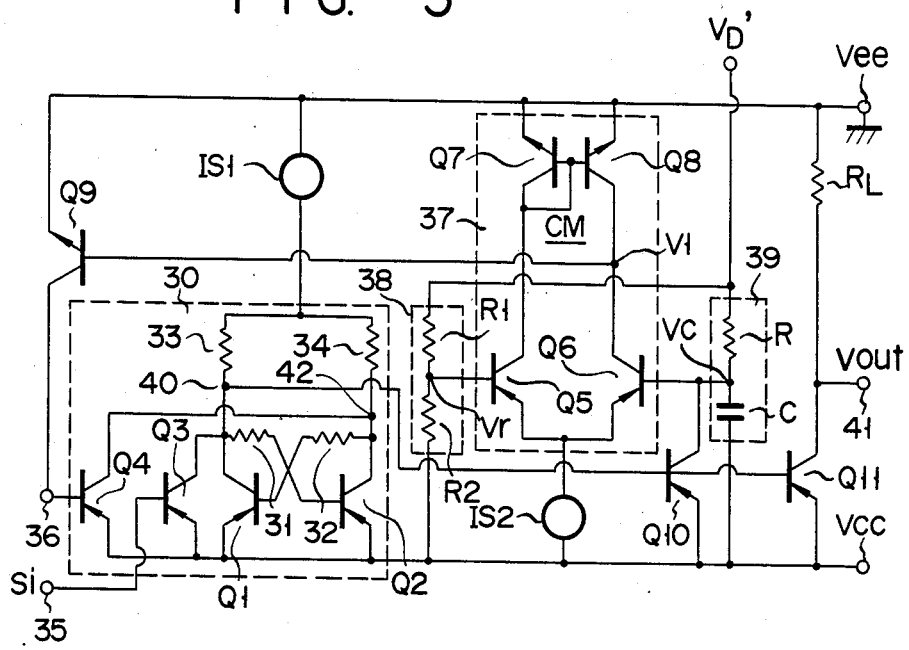
FIG. 5 is a circuit diagram of a monostable multivibrator according to another embodiment of the invention.

FIG. 5 shows a circuit diagram of a monostable multivibrator in a second embodiment of the invention. In this circuit of FIG. 5, the conductivity types of all transistors are replaced when compared to those in the circuit of the first mentioned embodiment (FIG. 3). That is, PNP transistors in the multivibrator of the first recited embodiment are replaced by NPN transistors in the multivibrator of this embodiment, and NPN transistors in the multivibrator of the first recited embodiment are replaced by PNP transistors in the multivibrator of this embodiment. Corresponding to the replacement of the transistors, the polarities of the power source potentials are also replaced. That is, high power source potential Vcc in the multivibrator of the first recited embodiment is replaced by low power source potential Vee in the multivibrator of this embodiment, and low power source potential Vee in the multivibrator of the first recited embodiment is replaced by high power source potential Vcc in the multivibrator of this embodiment. The predetermined voltage Vd in the circuit of the first mentioned embodiment is also replaced by a predetermined voltage Vd' in the circuit of this embodiment. The predetermined voltage Vd' is a lower potential than high power source potential Vcc. Others are substantially the same as those of the circuit of the first mentioned multivibrator. Therefore, corresponding parts or components are designated by corresponding numerals or characters, and the description is omitted. The operation is also substantially the same as that of the circuit of the first mentioned multivibrator, and the description is therefore omitted by merely showing in FIGS. 6A to 6E the time charts of signal waveforms at respective parts or portions in the multivibrator shown in FIG. 5. The time charts of FIGS. 6A to 6E correspond to the time charts of FIGS. 4A to 4E, respectively.

Figure 7:
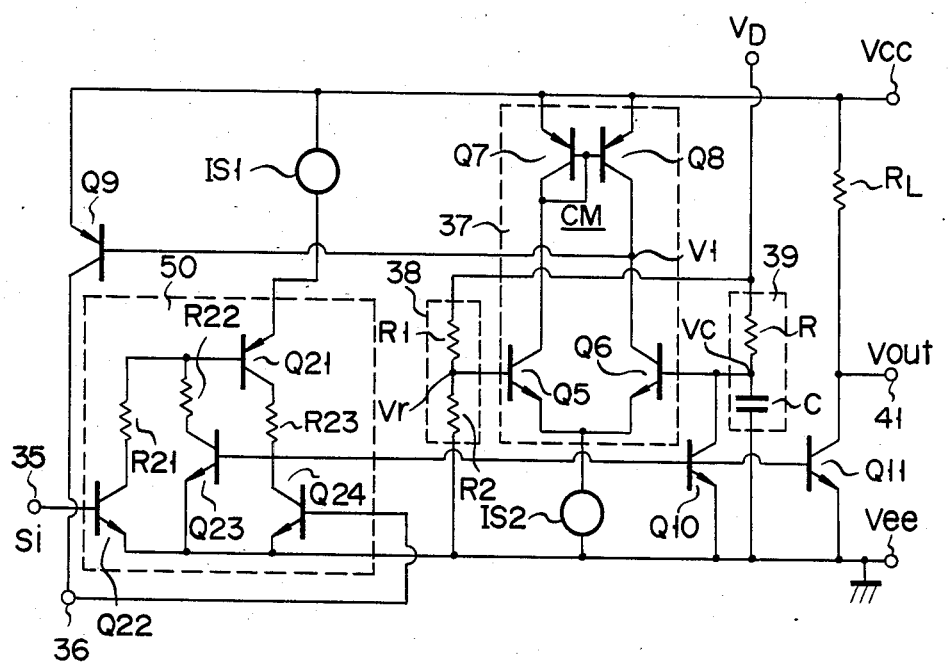
FIGS. 7, 8 and 9 show a circuit diagram of a monostable multivibrator according to other embodiments of the invention, respectively.

FIG. 7 shows a circuit diagram of a monostable multivibrator of a third embodiment of the invention. In this circuit, a thyristor circuit 50 is provided in place of flip-flop circuit 30 in the first mentioned multivibrator. Thyristor circuit 50 comprises resistors R11, R12 and R13, a PNP transistor Q21 and NPN transistors Q22, Q23 and Q24. Transistors Q21 and Q23 constitutes a thyristor 61. The emitter of transistor Q21 is connected to high power source potential Vcc through the current source IS1. The collector of transistor Q21 is connected to low power source potential Vee through resistor R13 and transistor Q14. The collector of transistor Q22 is connected to the base of transistor Q21 through resistor R11. The emitter of transistor Q22 is connected to low power source potential Vee. The base of transistor Q22 is connected to set input terminal 35. The collector of transistor Q23 is connected to the base of transistor Q21 through resistor R12. The emitter of transistor Q23 is connected to low power source potential Vee. The base of transistor Q23 is connected to the bases of transistors Q10 and Q11. The collector of transistor Q24 is connected to the collector of transistor Q21 through resistor R13 and is also connected to the bases of transistors Q10 and Q11. The emitter of transistor Q24 is connected to low power source potential Vee. The base of transistor Q24 is connected to reset input terminal 36. Other connections are substantially the same as those of the first recited multivibrator. Therefore, corresponding parts or components are designated by corresponding numerals or characters, and the description is omitted.

The operation of the multivibrator shown in FIG. 7 is as follows.

In a normal state, reset output terminal 40 of thyristor circuit 50 is at a high level. Now assume that thyristor circuit 50 is at a normal state. At this time, reset switch transistor Q10 and output buffer transistor Q11 are both in the ON state. Since transistor Q11 is in the ON state, an output voltage Vout of vibrator output terminal 41 is at a low level. Also since transistor Q10 is in the ON state, a capacitor voltage Vc at the junction of resistor R and capacitor C of time constant circuit 39, which is applied to the base of transistor Q6 of comparator circuit 37, is lower than reference voltage Vr at the junction of resistors R1 and R2 of divider circuit 38, which is applied to the base of transistor Q5 of comparator circuit 37. Thus, an electric current flows through current mirror circuit CM, and the output voltage Vl of comparator 37 is at a high level. Therefore, transistor Q9, as a reset signal generator whose base is applied with the voltage Vl, is in the OFF state and, thus, transistor Q4, as a reset switch, is also rendered OFF. In this state, now assume that a set trigger signal Si of a high level is inputted to set input terminal 35. At this time, transistor Q12 is momentarily rendered ON to set thyristor circuit 50. Therefore, reset output terminal 40 is changed to a low level and transistors Q10 and Q11 are both rendered OFF. Since transistor Q11 is rendered OFF, the output voltage Vout of vibrator output terminal 41 is changed to a high level. Also since transistor Q10 is rendered OFF, an electric current starts to flow through time constant circuit 39 to charge capacitor C.

When a predetermined period TO of time, which is determined by the reference voltage Vr and time constant defined by a capacitance of capacitor C and a resistance of resistor R, has passed from the time when an electric current has started to flow and capacitor voltage Vc exceeds reference voltage Vr to change the comparator output voltage V1 to a low level, an electric current starts to flow into transistor Q6 through the emitter-base path of transistor Q9. Therefore, transistor Q9 is rendered ON and, thus, transistor Q4 is also rendered ON. Therefore, thyristor circuit 50 is reset and the potential of reset output terminal 40 is changed to a high level. Since reset output terminal 40 is changed to a high level, transistor Q10 is turned ON to discharge capacitor C. Thus, comparator output voltage V1 is returned to a high level to turn transistor Q9 OFF. Thus, transistor Q9 produces a reset input signal to reset input terminal 36. Therefore, transistor Q4 is also turned OFF and reset output terminal 40 is maintained at a high level or reset state (normal state). Also since reset output terminal 40 is changed to a high level, transistor Q11, as an output buffer, is turned ON, and an output voltage Vout of vibrator output terminal 41 is changed to a low level.

Also in the monostable multivibrator of the embodiment just described above (FIG. 7), thyristor circuit or latch circuit 50 and comparator circuit 37 are separated. Therefore, an emitter-base voltage of any transistor does not constitute a component to define the pulse width of the output voltage Vout. A pulse width of the output voltage Vout of vibrator output terminal 41 equals the time period To and is determined by the reference voltage Vr and the time constant defined by a capacitance of capacitor C and a resistance of resistor R. Therefore, an output voltage of a pulse width independent of temperature is provided.

Figure 8:
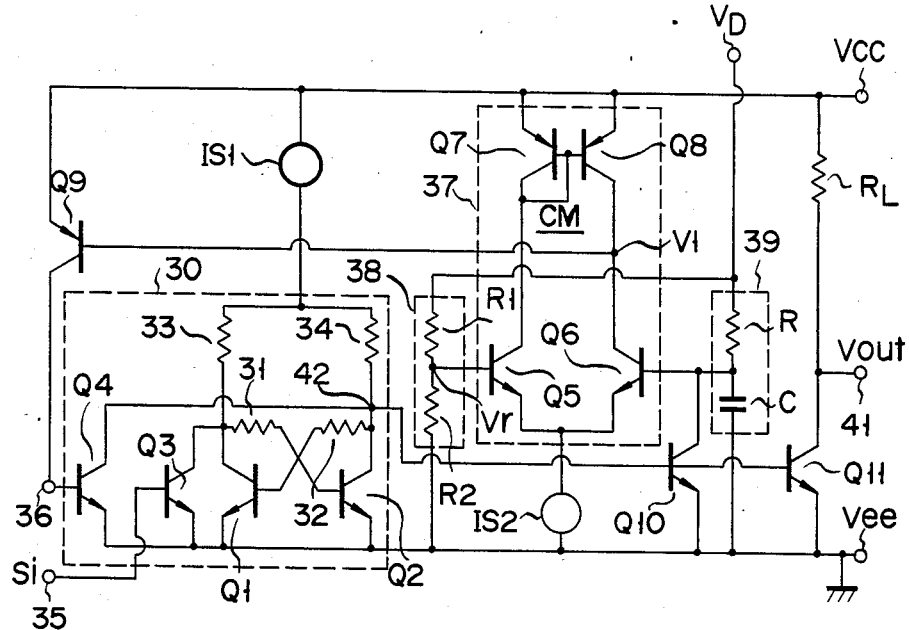

FIG. 8 shows a circuit diagram of a monostable multivibrator of a fourth embodiment of the invention. In this circuit, the base of transistor Q11 is connected to set output terminal 42 of flip-flop circuit 30. Another connection is substantially the same as that of the first recited multivibrator. Therefore, corresponding parts or components are designated by corresponding numerals or characters, and the description is omitted. The operation is also substantially the same as that of the circuit of the first mentioned multivibrator, and the description is therefore omitted.

Figure 9:
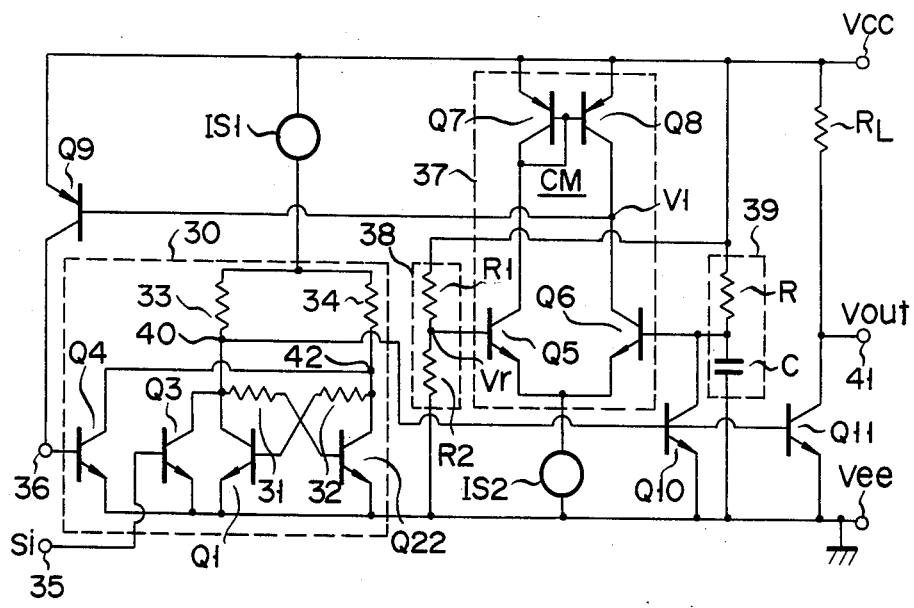

FIG. 9 shows a circuit diagram of a monostable multivibrator of a fifth embodiment of the invention. In this circuit, resistor R1 of voltage divider 38 and R of time constant circuit 39 are commonly connected to high power source potential Vcc. Another connection is substantially the same as that of the first recited multivibrator. Therefore, corresponding parts or components are designated by corresponding numerals or characters, and the description is omitted. The operation is also substantially the same as that of the circuit of the first mentioned multivibrator, and the description is therefore omitted.

Also with the circuit of the embodiment of FIG. 9, reference voltage circuit 38 and time constant circuit 39 are connected to the common power potential. Therefore, the circuits 38 and 39 are independent of any variation of the power source voltage, as in the multivibrator of the first recited embodiment.

Obviously, the multivibrators of the second to fifth embodiments described above have substantially the same effects as those of the first embodiment.

This invention is not limited to the embodiments described above. Many other embodiments or variations may be thought of by those skilled in the art and still lie within the spirit of the invention.

As will be clearly understood from the above, with a monostable multivibrator of the invention, an output voltage whose pulse width is independent of temperature is provided. When a multivibrator of the invention is incorporated in a F/V (frequency to voltage) converter of a motor control circuit, a fine control of the rotation speed of a motor can be obtained.

What is claimed is:

1. A monostable multivibrator comprising:
voltage dividing means for dividing a voltage defined by a predetermined potential and a first power source potential to generate a reference potential, said voltage dividing means comprising first and second impedance means connected in series between said predetermined potential and said first power source potential, said reference potential appearing at the connection between said first and second impedance means;
time constant circuit means connected between said predetermined potential and said first power source potential, said time constant circuit means comprising a third impedance means and a capacitive means connected in series between said predetermined potential and said first power source potential, an output potential appearing at the connection between said third impedance means and said capacitive means;
comparator circuit means for comparing said reference potential of said voltage dividing means and said output potential of said time constant circuit means, said comparator circuit means comprising a current mirror circuit having current source circuit means and differential amplifier means connected in series between a second power source potential and said first power source potential, said current source circuit means for supplying an electric current to said differential amplifier means being connected at one end to said second power source potential and at the other end to said differential amplifier means, said differential amplifier means for receiving said reference potential and said output potential of said time constant circuit means to produce a comparator circuit output signal being connected at one end to said current source circuit means and at the other end to said first power source potential;
set input terminal means to which a set input signal is supplied;
reset signal generating means for generating a reset input signal in response to said comparator circuit output signal;
latch circuit means to which the reset input a signal of the reset signal generating means and the set input signal of the set input terminal means are applied to produce set and reset output signals; and switch means for discharging an electric charge stored at the time constant circuit means in response to said set and reset output signals of said latch circuit means, said switch means providing a first monostable multibrator output when said electric charge is stored and a second monostable multivibrator output when said electric charge is discharged.

2. A monostable multivibrator according to claim 1, in which said current mirror circuit comprise first and second transistors, said differential amplifier comprises third and fourth transistors wherein control terminals of said first and second transistors are interconnected, one terminal of the output current path of each of said first and second transistors is connected to said second power source potential, the other terminal of the output current path of each of said first and second transistors is connected to one terminal of an output current path of each of said third and fourth transistors, respectively, the other terminal of the output current path of each of said third and fourth transistors is connected to said first power source potential, the control terminal of said third transistor is connected to said reference potential, and the control terminal of said fourth transistor is connected to said output potential of said time constant circuit means.

3. A monostable multivibrator according to claim 2, in which said first and second transistors are of a first bipolar type, and said third and fourth transistors are of a second bipolar type.

4. A monostable multivibrator according to claim 3, in which said first bipolar type is PNP type, and said second bipolar type in NPN type.

5. A monostable multivibrator according to claim 4, in which said first power source potential has a potential lower than the potential of said second power source potential.

6. A monostable multivibrator according to claim 1, in which said first impedance means comprises a resistive means.

7. A monostable multivibrator according to claim 6, in which said resistive means comprises a resistor.

8. A monostable multivibrator according to claim 1, in which said second impedance means comprises a resistive means.

9. A monostable multivibrator according to claim 8, in which said resistive means comprises a resistor.

10. A monostable multivibrator according to claim 1, in which said third impedance means comprises a resistive means.

11. A monostable multivibrator according to claim 10, in which said resistive means comprises a resistor.

12. A monostable multivibrator according to claim 1, in which said capacitive means comprises a capacitor.

13. A monostable multivibrator according to claim 1, in which the potential of said predetermined potential is not the same as the potential of said second power source potential.

14. A monostable multivibrator according to claim 1, in which the potential of said predetermined potential is the same as the potential of said second power source potential.

* * * * *